United States Patent [19]
Gardner et al.

[11] Patent Number: 6,124,188
[45] Date of Patent: Sep. 26, 2000

[54] SEMICONDUCTOR DEVICE AND FABRICATION METHOD USING A GERMANIUM SACRIFICIAL GATE ELECTRODE PLUG

[75] Inventors: Mark I. Gardner, Cedar Creek; H. Jim Fulford, Austin, both of Tex.

[73] Assignee: Advanced Micro Devices, Inc., Sunnyvale, Calif.

[21] Appl. No.: 09/203,012

[22] Filed: Dec. 1, 1998

[51] Int. Cl.[7] ............................................. H01L 21/3205
[52] U.S. Cl. ...................... 438/585; 438/305; 438/595; 438/692
[58] Field of Search .................... 438/585, 595, 438/305, 692

[56] References Cited

U.S. PATENT DOCUMENTS

| | | |
|---|---|---|
| 5,168,072 | 12/1992 | Moslehi . |
| 5,391,510 | 2/1995 | Hsu et al. . |
| 5,429,956 | 7/1995 | Shell et al. . |
| 5,434,093 | 7/1995 | Chau et al. . |
| 5,534,447 | 7/1996 | Hong . |
| 5,538,913 | 7/1996 | Hong . |
| 5,576,227 | 11/1996 | Hsu . |
| 5,773,348 | 6/1998 | Wu . |
| 5,856,225 | 1/1999 | Lee et al. . |
| 5,960,270 | 9/1999 | Misra et al. . |
| 5,985,726 | 11/1999 | Yu et al. . |
| 5,994,179 | 11/1999 | Masuoka . |
| 6,043,157 | 3/2000 | Gadner et al. . |
| 6,051,487 | 4/2000 | Gardner et al . |

*Primary Examiner*—John F. Niebling
*Assistant Examiner*—Jonathan Hack

[57] ABSTRACT

Semiconductor devices and fabrication processes which rely on the use of sacrificial gate electrode plugs are provided. In one embodiment, a germanium bearing plug is used to form a gate electrode. The germanium plug may advantageously be removed using a solution which leaves underlying portions of the oxide layer intact. In another embodiment, spacers are formed adjacent sidewalls of a sacrificial plug and active regions are formed adjacent the sacrificial plug. The sacrificial plug is then removed to form an opening between the spacers and a conductive layer is deposited over the substrate to form a gate electrode and active region contacts.

20 Claims, 3 Drawing Sheets

SEMICONDUCTOR DEVICE AND FABRICATION METHOD USING A GERMANIUM SACRIFICIAL GATE ELECTRODE PLUG

FIELD OF THE INVENTION

The present invention is directed generally to semiconductor devices and, more particularly, to semiconductor devices and fabrication methods using a sacrificial plug for defining a region for a gate electrode.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 and are connected to source/drain terminals (not shown). The typical MOS transistor is symmetrical, which means that the source and drain are interchangeable. Whether a region acts as a source or drain depends on the respective applied voltages and the type of device being made (e.g., PMOS, NMOS, etc.).

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The gate insulating layer 109 is provided to prevent current from flowing between the gate electrode 103 and the source/drain regions 105 or channel region 107.

After the source/drains 105 have been formed, a relatively thick oxide layer (not shown), referred to as a contact formation layer, is disposed over the substrate 101. Openings are generally cut into the contact formation layer to expose the source/drain regions 105 and the surface of the gate electrode 103. The exposed areas are then filled with a metal, such as tungsten, to form contacts which are used to connect the active elements with other devices on the chip.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

The formation of the gate electrode is an important step in the fabrication process. Typically, the gate electrode is formed by depositing a layer of polysilicon over a thin silicon dioxide layer (i.e., the gate insulating layer), patterning the polysilicon layer, and selectively removing portions of the polysilicon layer and the underlying silicon dioxide layer to form one or more gate electrodes as illustrated above. Using the gate electrode for alignment, dopants are implanted into the substrate to form the source/drain regions.

These conventional techniques for forming the gate electrode impose limitations on the fabrication process. In particular, the use of the gate electrode to align source/drain implants imposes significant limitations of the type of gate electrode material which may be used. For example, since the source/drain regions are typically annealed to activate the dopants therein, the gate electrode is typically limited to a material, such as polysilicon, which can withstand the high temperatures of the source/drain anneal.

SUMMARY OF THE INVENTION

Generally, the present invention relates to semiconductor devices and fabrication methods using a sacrificial plug for forming a gate electrode. In accordance with one embodiment of the invention, a semiconductor device is formed by forming an oxide layer over a substrate and a germanium bearing plug over the oxide layer. Active regions are formed in the substrate adjacent the plug and a film is formed over portions of the substrate adjacent the plug. The germanium bearing plug is then selectively removed, to form an opening in the film, using a solution which leaves the oxide layer intact. A gate electrode is then formed in the opening. The gate electrode may be formed from metal, for example. The solution may, for example, be a mixture of water, ammonium hydroxide and hydrogen peroxide. The use of such a solution can, for example, allow the germanium plug to be removed without substantially affecting underlying portions of the oxide layer. The oxide layer may then be used, in whole or in part, as a gate insulating layer.

In accordance with another embodiment of the invention, a semiconductor device is formed by forming a sacrificial plug over a substrate. Active regions are formed in portions of the substrate adjacent the sacrificial plug and spacers are formed on sidewalls of the sacrificial plug. The sacrificial plug being selectively removable with respect to the spacers. The sacrificial plug is then selectively removed to leave an opening between the spacers. A conductive layer is then deposited over the substrate to form a gate electrode in the opening and contacts over the active regions adjacent the spacers.

A semiconductor device, according to another embodiment, includes a substrate and a gate electrode separated from the substrate by an insulating layer, active regions disposed in the substrate adjacent the gate electrode, spacers formed on sidewalls of the gate electrode, and contacts formed over the active regions and adjacent the spacers. The contacts and gate electrode are formed from a common conductive layer, such as a copper layer.

The above summary of the present invention is not intended to describe every incrementation of the present invention. The figures and the detailed description which follow exemplify the embodiments more particularly.

BRIEF DESCRIPTION OF THE DRAWINGS

The invention may be more completely understood in consideration of the detailed description of the following embodiments of the invention in connection with the accompanying drawings, in which.

Figure 1:
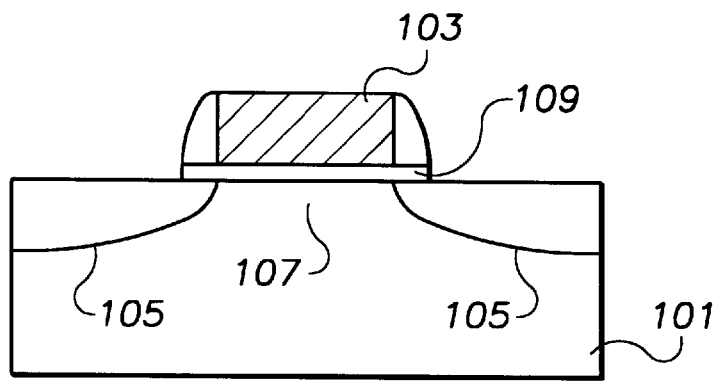
FIG. 1 illustrates a conventional MOS transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to the fabrication of a number of semiconductor devices, including in particular MOS, CMOS, and BiCMOS structures. While the present invention is not so limited, an appreciation of various aspects of the invention will be gained through a discussion of the fabrication process and characteristics of such a device in connection with the examples provided below.

FIGS. 2A–2E illustrate an exemplary process for fabricating a semiconductor device using a germanium bearing plug for defining a region for a gate electrode. In this exemplary process, an oxide layer 203 is formed over a substrate 201. The substrate 201 is typically formed from a semiconductor material, such as silicon. The oxide layer 203 may be formed a number of different insulating materials. Suitable materials include oxides, such as silicon dioxide ($SiO_2$) or metal oxides such as titanium dioxide. A silicon dioxide gate oxide layer may be formed using, for example, well-known deposition or growth techniques.

Suitable thicknesses for a silicon dioxide gate oxide may range from about 15 to 50 angstroms (Å) for many applications. When using other oxides, such as metal oxides, their thickness typically scale with their dielectric constants to provide a gate oxide layer having capacitive characteristics equivalent to about 15 to 50 Å of silicon dioxide. Optionally, the oxide layer 203 may be dipped in a hydrofluoric acid (HF) solution (e.g., 100 parts HF to 1 part $H_2O$) to further reduce the thickness of the oxide layer 203.

Figure 2A:
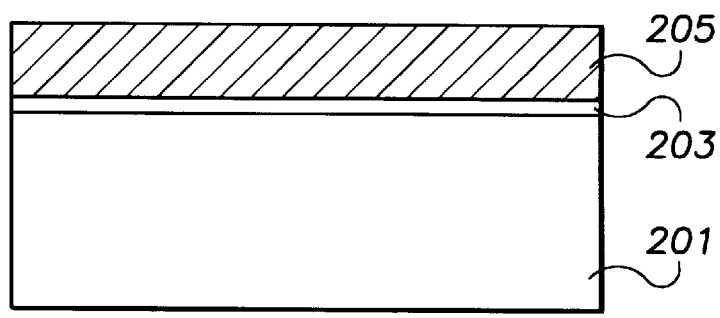
FIGS. 2A–2E illustrate an exemplary process in accordance with one embodiment of the invention.

One or more germanium bearing plugs are formed over the oxide layer for use in forming gate electrode(s). In the illustrated process, the plug(s) are formed from silicon (Si) and germanium (Ge) by forming a silicon and germanium bearing layer 205 over the oxide layer 203. The resultant structure is illustrated in FIG. 2A. The silicon and germanium bearing layer 205 will be used to form one or more silicon and germanium bearing plugs, which in turn will be removed from over the oxide layer 203 in order to form one or more openings for a gate electrode(s).

The thickness of the silicon and germanium bearing layer 205 is typically chosen in consideration of the desired thickness of the gate electrode(s). Suitable thicknesses of the silicon and germanium bearing layer 205 range from about 1000 to 3000 Å for many applications. The relative amounts of silicon and germanium in the silicon and germanium bearing layer 205 are typically selected to allow the silicon and germanium bearing layer 205 to be removed from over the oxide layer 203 without substantially affecting the oxide layer 203. For many applications, the ratio of Ge atoms to Si atoms may range from 1:4 to 2:3 or greater. The use of germanium advantageously allows the plug(s) to be removed while leaving underlying portions of the oxide layer 203 intact.

The silicon and germanium bearing layer 205 may be formed in a number of different manners. For instance, the silicon and germanium bearing layer 205 may be deposited using low pressure chemical vapor deposition (LPCVD) or plasma vapor deposition (PVD) of silicon and germanium. PVD typically allows for a more controlled deposition, while LPCVD typically provides a faster deposition rate. In one particular LPCVD embodiment, a silicon gas (e.g., Silane) and a germanium gas (e.g., $GeH_4$) are flowed into a reaction chamber and reacted to form the silicon and germanium bearing layer 205. A carrier gas, such as nitrogen, may be provide with the silance and/or germanium gas or may be flowed into the chamber separately. Suitable reaction conditions include temperatures ranging from about 500° C. to 600° C. and pressures ranging from about 50 to 400 millitorr. Suitable flow rates range from about 50 to 100 sccm (standard cubic centimes per minute) for Silane, 50 to 100 sccm for $GeH_4$ and 5 to 20 sccm for nitrogen. Reaction times can vary depending on desired thickness of the silicon and germanium layer 205. For many applications, reaction times ranging form 15 to 60 minutes would be suitable.

Figure 2B:
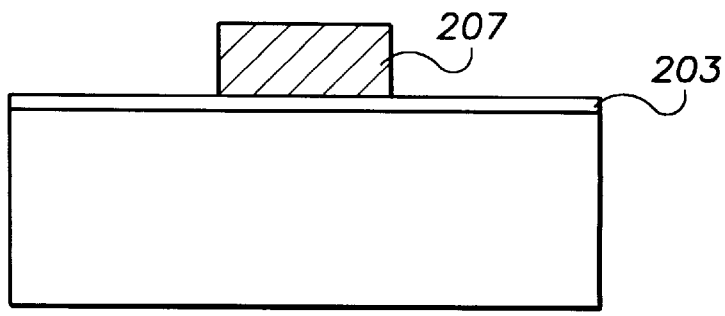
Figure 2C:
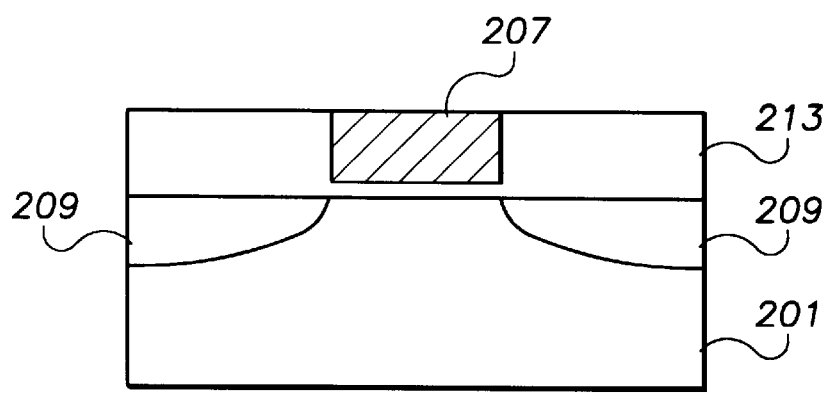

Next, in the illustrated embodiment, portions of the silicon and germanium bearing layer 205 are removed to form one or more silicon and germanium bearing plugs 207 (only one of which is shown) over the oxide layer 203. The resultant structure is shown in FIG. 2B. This removal process may be performed using known photolithography and etching techniques. Suitable etching techniques include plasma etching, for example. Portions of the oxide layer 203 adjacent the plug 207 may be removed or left intact, as shown in FIG. 2B. The plug 207 will, as noted above, be used to define a region for a gate electrode. The width of the plug 207 is typically chosen in consideration of the desired width of the gate electrode. Suitable widths of the plug 207 range from about 0.1 to 0.25 microns for many applications.

Active regions 209 are formed in portions of the substrate 201 adjacent the plug 207. The active regions 209 are typically used as source and drain regions and may be formed using known techniques. For instance, active regions may be formed by implanting dopants into the substrate and annealing the substrate to activate the dopants. Spacers may be formed on sidewalls of the plug 207 during, after or even prior to formation of the active regions 209. The spacers, if any, may be formed using, for example, known techniques and are typically formed from a material which allows the plug 207 to be selectively etched, while leaving the spacers intact. Suitable spacer materials include oxides, such as silicon dioxide, for example.

Figure 2D:
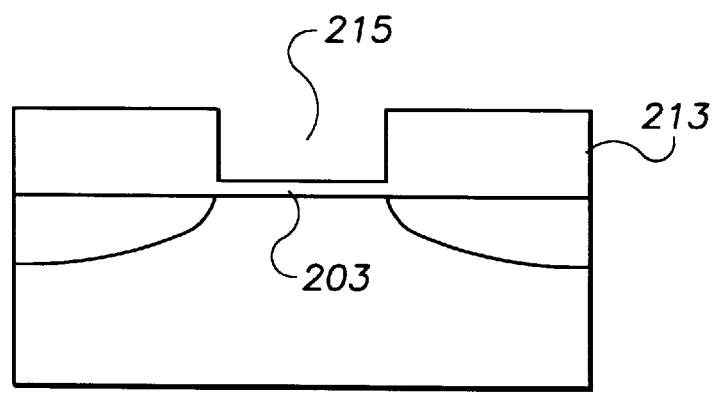
Figure 2E:
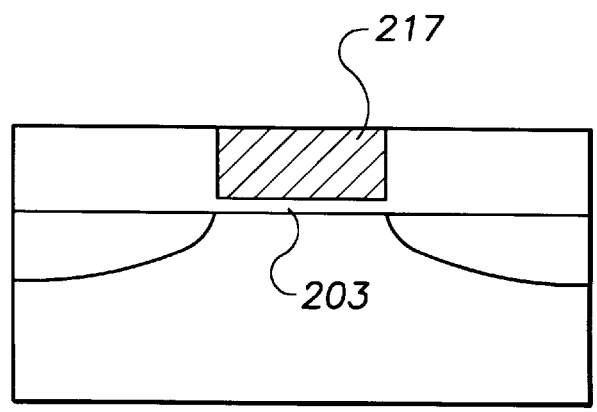

A film 213 is formed over portions of substrate 201 adjacent the plug 207, as shown in FIG. 2D. The film 213 may be formed, for example, using well-known deposition techniques. In an exemplary embodiment, the film 213 is deposited to a thickness greater than that of the plug 207 and then substantially planarized with the upper surface of the plug 207. The film 213 may be planarized using, for example, well-known chemical-mechanical polishing techniques. The film 213 is typically formed from a material that allows the plug 207 to be selectively removed with respect to film 213. For example, film 213 may be formed from an oxide or nitride, such as silicon dioxide oxynitride, or silicon nitride. If spacers were earlier formed, they may, if formed of a suitable material, be left to form part of film 213 or may be removed before forming the film 213.

The silicon and germanium plug 207 is then selectively removed to form an opening 215 in the film 213 using a solution which leaves the insulating film 213 substantially intact. The resultant structure is illustrated in FIG. 2D. This allows the underlying oxide layer 203 beneath the plug 207 to be used, at least in part, as a gate insulating layer. Suitable solutions include water ($H_2O$), hydrogen peroxide ($H_2O_2$), and ammonium hydroxide ($NH_4OH$) mixtures. While the concentration of the components may vary, suitable mixtures include from 6 to 10 parts water, 0.5 to 2 parts hydrogen peroxide, and 0.5 to 2 parts ammonium hydroxide (e.g., from 3:1:1 to 20:1:1). One exemplary mixture is 5:1:1 ($H_2O:H_2O_2:NH_4OH$). After removing the plug 207, an optional HF dip, similar to the HF dip noted above, may be performed to reduce the thickness of the oxide layer 203 in the opening 215.

A gate electrode 217 is formed in the opening 215 over the oxide layer 203, as illustrated in FIG. 2F. The gate electrode 217 may be formed from any suitable gate electrode material, such as metal or polysilicon. The gate electrode 217 may, for example, be formed by depositing a layer of gate electrode material over the substrate and planarizing the gate electrode layer to form the gate electrode 217 in the opening. This may be done using, for example, known deposition and chemical-mechanical polishing techniques. Fabrication of the semiconductor device may continue with known processing steps such as contact formation, metal layer formation, and so forth to complete the device structure.

Using the above process, a gate electrodes may be formed using a silicon and germanium bearing plug. This type of plug is advantageously removed using a solution which can leave an underlying oxide layer substantially unaffected. This, for example, can allow the use of the underlying oxide layer as a gate insulating layer without further processing. In addition, the above process allows active regions to be formed prior to gate electrode. This allows, for example, the gate electrode to be formed from materials, including metals such as copper, which are sensitive to high temperature treatments, such as the source/drain anneal. Of course, source/drain formation can alternatively be performed after forming the gate electrode if desired.

Figure 3A:
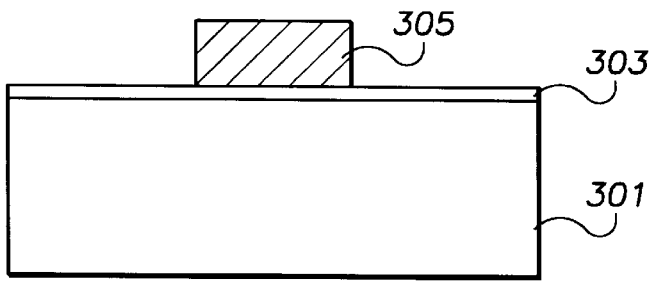
FIGS. 3A–3D illustrate an exemplary process in accordance with another embodiment of the invention.

FIGS. 3A–3D illustrate another exemplary process for fabricating a semiconductor device using a sacrificial plug. In this exemplary process, an insulating layer 303 is formed over a substrate 301. The type of insulating layer may vary and may, for example, be similar to the oxide layer 203 discussed above. One or more sacrificial plugs (only one of which is shown) is formed over the insulating layer 303. The plug 305 will be used to form a gate electrode. The plug 305 may be formed from germanium or silicon and germanium, in a similar manner as discussed above, or from another type of material, such as polysilicon or a nitride. The resultant structure is illustrated in FIG. 3A.

Figure 3B:
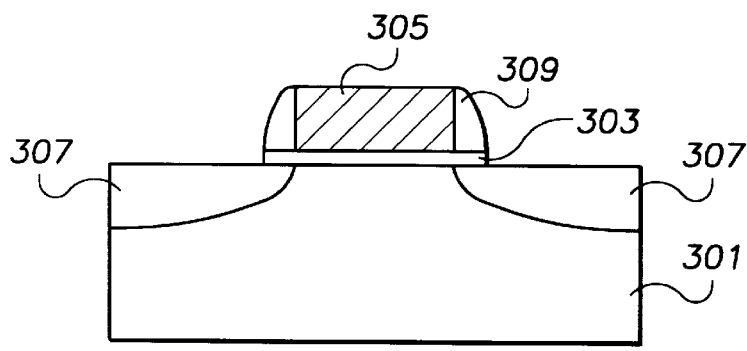

Active regions 307 are formed in portions of the substrate 301 adjacent the plug 305. The active regions 307 are typically used as source and drain regions and may be formed using known techniques. Spacers 309 are formed on sidewalls of the plug 305 during, after or even prior to formation of the active regions 307. The spacers 309 may be formed using, for example, known techniques and are typically formed from a film which allows the plug 305 to be selectively etched while leaving the spacers 309 intact. Suitable spacer materials include oxides or nitrides, such as silicon dioxide, oxynitride, and silicon nitride, for example. The resultant structure is illustrated in FIG. 3B. During spacer formation, portions of the oxide layer 303 over substrate regions adjacent the plug 305 may be removed, as shown.

Figure 3C:
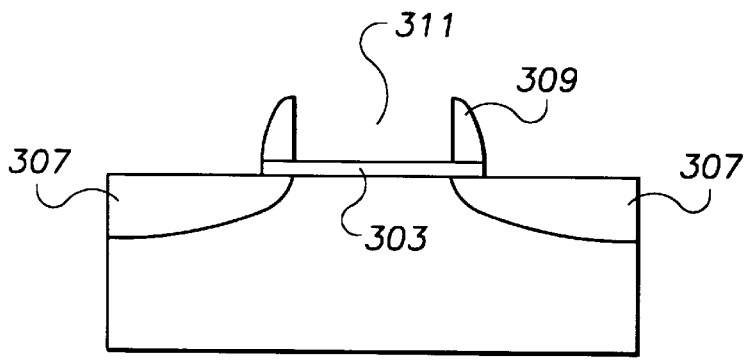
Figure 3D:
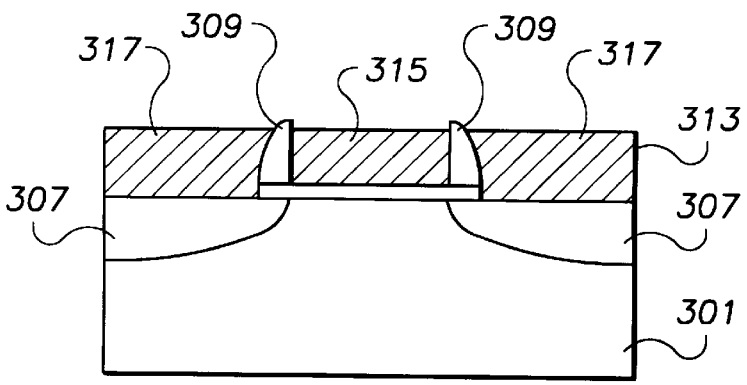

The plug 305 is then selectively removed while leaving the spacers 309 substantially intact to form an opening 311 between the spacers 309. The resultant structure is illustrated in FIG. 3C. The plug 305 is typically removed using etching techniques which selectively etch the plug 305 while leaving the substrate 301 and spacers 311 intact. The plug 305, when including germanium, may advantageously be removed using a solution, such as those described above, which can leave the underlying insulating layer 303 substantially intact. This, for example, allows the insulating layer 303 beneath the opening 311 to be used, at least in part, as a gate insulating layer without further processing. After removing the plug 305, an optional HF dip (e.g.,. a 100 HF:1 $H_2O$) may be performed to reduce the thickness of the insulating layer 303 in the opening 311 and remove any native oxide which may have formed over the active regions 307.

A conductive layer 313 is then formed over the substrate 301 to form a gate electrode 315 and contacts 317 for the active regions 307. The conductive layer 313 may, for example, be deposited over the substrate 301 and polished to form the gate electrode 315 in the opening 311 and contacts 317 adjacent the spacers 309. This may be performed using, for example, known deposition and polishing techniques. Typically, the conductive layer 313 is overpolished to recess the gate electrode 315 and contacts 317 with respect to the upper surface of the spacers 309 to separate the gate electrode 315 from the contacts 317 and prevent shorting therebetween. The conductive layer 313 may be formed from a metal, such as copper, cobalt or titanium, a metal compound, or doped polysilicon. In this manner, a gate electrode and contacts for adjacent active regions may be integrally formed. This can, for example, reduce the number of fabrication steps involved in fabricating the device. Fabrication of the semiconductor device may continue with known processing steps such as metal layer formation and so forth to complete the device structure.

The present invention is applicable to the fabrication of a number of different devices where formation of a gate electrode using a sacrificial plug is desirable. Accordingly, the present invention cannot be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed, upon review of the present specification. The claims are intended to cover such modifications and devices.

What is claimed is:

1. A process of fabricating a semiconductor device, comprising:

forming an oxide layer over a substrate forming at least one germanium bearing plug over the oxide layer, the plug defining a region for a gate electrode;

forming active regions in portions of the substrate adjacent the plug;

forming a film over the portions of the substrate adjacent the plug, the plug being selectively removable with respect to the film;

selectively removing the plug, to form an opening in the film, using a solution which leaves the oxide layer intact; and forming a gate electrode in the opening and over the oxide layer, the oxide layer forming at least part of a gate insulating layer for the gate electrode.

2. The process of claim 1, wherein forming the at least one germanium bearing plug includes:

depositing a silicon and germanium bearing layer over the oxide layer; and selectively removing portions of the silicon and germanium bearing layer to form the plug.

3. The process of claim 2, wherein depositing the silicon and germanium bearing layer includes reacting silane with $GeH_4$.

4. The process of claim 2, wherein the ratio of germanium to silicon in the silicon and germanium bearing plug is 1:4 or more.

5. The process of claim 2, wherein the ratio of germanium to silicon in the silicon and germanium bearing plug ranges from 1:4 to 2:3.

6. The process of claim 1, wherein selectively removing the plug with a solution includes using a solution containing water, hydrogen peroxide, and ammonium hydroxide.

7. The process of claim 6, wherein the solution includes 6 to 10 parts water, 0.5 to 2 parts hydrogen peroxide, and 0.5 to 2 parts ammonium hydroxide.

8. The process of claim 7, further including contacting the oxide layer with hydrofluoric acid solution after removing the plug and before forming the gate electrode.

9. The process of claim 1, wherein forming the gate electrode includes forming the gate electrode from copper.

10. The process of claim 1, wherein forming the film includes forming spacers on sidewalls of the plug.

11. The process of claim 10, further including forming active region contacts adjacent the spacers, the active region contacts and gate electrode being formed from a common conductive layer.

12. The process of claim 1, wherein forming the film includes depositing an oxide over the substrate and polishing the oxide to expose the plug.

13. A process of fabricating a semiconductor device, comprising:

forming a sacrificial plug over a substrate, the sacrificial plug includes forming a germanium bearing plug, the plug defining a region for a gate electrode;

forming active regions in portions of the substrate adjacent the sacrificial plug;

forming spacers on sidewalls of the sacrificial plug, the sacrificial plug being selectively removable with respect to the spacers;

selectively removing the sacrificial plug to leave an opening between the spacers; and forming a conductive layer over the substrate to form a gate electrode in the opening and active region contacts adjacent the spacers.

14. The process of claim 13, wherein removing the sacrificial plug includes removing the plug without substantially affecting the oxide layer beneath the plug.

15. The process of claim 13, wherein removing the sacrificial plug includes using a solution containing water, hydrogen peroxide, and ammonium hydroxide.

16. The process of claim 13, further including removing any native oxide on the substrate prior to forming the conductive layer.

17. The process of claim 15, wherein removing native oxide includes using a hydrofluoric acid solution.

18. The process of claim 13, wherein forming the a conductive layer over the substrate to form the gate electrode and the active region contacts includes depositing and polishing the conductive layer.

19. The process of claim 17, wherein polishing includes overpolishing the conductive layer to recess the conductive layer from an upper surface of the spacers.

20. The process of claim 13, wherein the conductive layer is a copper layer.

* * * * *